(12) United States Patent
Chang

(10) Patent No.: US 8,460,971 B2
(45) Date of Patent: Jun. 11, 2013

(54) SEMICONDUCTOR DEVICE PACKAGING STRUCTURE AND PACKAGING METHOD

(75) Inventor: Wen-Hsiung Chang, Hsinchu (TW)

(73) Assignee: Ineffable Cellular Limited Liability Company, Wilmington, DE (US)

( * ) Notice: Subject to any disclaimer, the term of this patent is extended or adjusted under 35 U.S.C. 154(b) by 300 days.

(21) Appl. No.: 12/774,811

(22) Filed: May 6, 2010

(65) Prior Publication Data

US 2011/0272795 A1 Nov. 10, 2011

(51) Int. Cl.
*H01L 23/12* (2006.01)
(52) U.S. Cl.
USPC ...... 438/113; 438/15; 257/680; 257/E21.499; 257/E21.531; 257/E23.003
(58) Field of Classification Search
USPC ... 257/678–733, 787–796, E23.001–E23.194
See application file for complete search history.

(56) References Cited

U.S. PATENT DOCUMENTS

| | | | |
|---|---|---|---|
| 2001/0005043 A1* | 6/2001 | Nakanishi et al. | 257/678 |
| 2008/0277799 A1* | 11/2008 | Benson et al. | 257/774 |
| 2010/0087014 A1* | 4/2010 | Nagai | 438/3 |
| 2011/0133344 A1* | 6/2011 | Nguyen et al. | 257/776 |

\* cited by examiner

*Primary Examiner* — Mamadou Diallo

(57) ABSTRACT

Exemplary semiconductor device packaging structure and packaging method are provided. The packaging method uses an adhesive layer to bond multiple wafer pieces onto a first surface of a carrier substrate, each adjacent two of the wafer pieces having a gap formed therebetween for exposing a part of the adhesive layer. A packaging layer is filled in each of the gaps. At least one through silicon via is formed each of the wafer pieces to expose a bonding pad formed on an active surface of the wafer pieces. Redistribution circuit layers are formed on back surfaces of the respective wafer pieces and filled into the through silicon vias for electrical connection with the bonding pads. A sawing process is performed to saw starting from each of the packaging layers to a second surface of the carrier substrate, and thereby multiple semiconductor device packaging structures are obtained.

6 Claims, 3 Drawing Sheets

SEMICONDUCTOR DEVICE PACKAGING STRUCTURE AND PACKAGING METHOD

BACKGROUND

1. Technical Field

The present invention generally relates to semiconductor device packaging methods and packaging structures and, particularly to a semiconductor device packaging method and a packaging structure with improved yield.

2. Description of the Related Art

A primary processed unit for current semiconductor processing equipments is a whole wafer, and the whole wafer after being processed would inevitably have some regions thereof occurring electrical or structural failure issue resulting from manufacturing process defects. When a ratio of the failed regions to the total area of the whole wafer is excessive high, if the processed whole wafer still is taken for subsequent process such as packaging, which not only wastes the manufacturing capacity of the equipments but also increases the manufacturing cost and even reduces the yield of finished products.

BRIEF SUMMARY

Accordingly, the present invention is directed to a semiconductor device packaging method, for improving the yield of packaging structure.

The present invention further is directed to a semiconductor device packaging structure having better packaging effect.

More specifically, a semiconductor device packaging method in accordance with an embodiment of the present invention is provided. A carrier substrate and a plurality of wafer pieces are firstly provided. Each of the wafer pieces has an active surface and a back surface. The active surface of each of the wafer pieces is opposite to the back surface thereof and at least one bonding pad formed thereon. Subsequently, an adhesive layer is formed on the carrier substrate, and then the packaging region of each of the wafer pieces is bonded to the adhesive layer. Each adjacent two of the wafer pieces have a gap existed therebetween and whereby exposing a part of the adhesive layer. Afterwards, packaging layers are filled into the respective gaps. At least one through silicon via is formed in each of the wafer pieces to expose corresponding bonding pad. Thereafter, redistribution circuit layers are formed the back surfaces of the respective wafer pieces and filled into the through silicon vias for electrical connection with the respective bonding pads. Finally, a sawing process is performed to saw the packaging layer, the adhesive layer and the carrier substrate at each of the gaps, and thereby a plurality of semiconductor device packaging structures are obtained.

In one embodiment, before the sawing process is performed, a protective layer is firstly formed on the back surfaces of the wafer pieces to cover the redistribution circuit layers. The protective layer has a plurality of openings each for exposing a part of the corresponding redistribution circuit layer. A plurality of solder balls then are filled into the openings for electrical connection with the respective redistribution circuit layers.

In one embodiment, after the through silicon vias are formed and before the redistribution circuit layers are formed, a dielectric layer is firstly formed on the back surfaces of the wafer pieces and filled into the through silicon vias, a part of the dielectric layer in the through silicon vias then is removed for exposing the bonding pads.

In one embodiment, a method for providing the wafer pieces includes the sub-steps of: firstly providing a wafer, then performing an electrical test applied to the wafer to acquire a plurality of available regions of the wafer, cutting the available regions down from the wafer and thereby the wafer pieces are obtained.

In one embodiment, before the through silicon vias are formed, the wafer pieces are firstly thinned.

In one embodiment, a method for filling the packaging layers into the gaps includes dispensing.

In one embodiment, after the packaging layers are filled into the gaps, a grinding and polishing process is applied to the packaging layers to remove portions of the packaging layers protruding from the back surfaces of the respective wafer pieces.

A semiconductor device packaging structure in accordance with an embodiment of the present invention includes a carrier substrate, a chip, an adhesive layer and a packaging layer. The carrier substrate has a first surface with configuration region and a packaging region surrounding the configuration region. The chip is disposed above configuration region of the carrier substrate. The adhesive layer is disposed across the configuration region and the packaging region and between the chip and the carrier substrate. The packaging layer is disposed on the adhesive layer and corresponding to the packaging region so as to surround the chip.

In one embodiment, the semiconductor device packaging structure further includes a redistribution circuit layer. The chip has an active surface, a back surface and a through silicon via. The active surface with at least one bonding pad is opposite to the back surface and faces toward the carrier substrate. The through silicon via penetrates from the back surface to the active surface and exposes the bonding pad. The redistribution circuit layer is disposed on the back surface of the chip and filled into the through silicon via for electrical connection with the bonding pad.

In one embodiment, a semiconductor element has been further formed on the active surface of the chip and surrounded by the adhering layer.

In one embodiment, the semiconductor device packaging structure further includes a dielectric layer disposed between the redistribution circuit layer and the chip.

In one embodiment, the semiconductor device packaging structure further includes a protective layer and at least one solder ball. The protective layer is disposed on the redistribution circuit layer and has at least one opening for exposing a part of the redistribution circuit layer. The solder ball is disposed on the protective layer and filled into the opening for electrical connection with the redistribution circuit layer.

In one embodiment, the semiconductor element may be a color filter array. Moreover, the semiconductor further includes a micro-lens array disposed between the color filter array and the chip.

In one embodiment, a material of the carrier substrate is for example a transparent material.

In one embodiment, a material of the packaging layer is for example a thermosetting material.

In summary, the above-mentioned embodiments of the present invention bond the wafer pieces to the carrier substrate and then perform subsequent process applied to the wafer pieces bonded on the carrier substrate. Due to the wafer pieces all are available regions of an original wafer(s), the embodiments of the present invention only perform a packaging process applied to the wafer pieces rather than the whole wafer(s), which not only can reduce the process cost but also can improve the yield of semiconductor device.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1A:
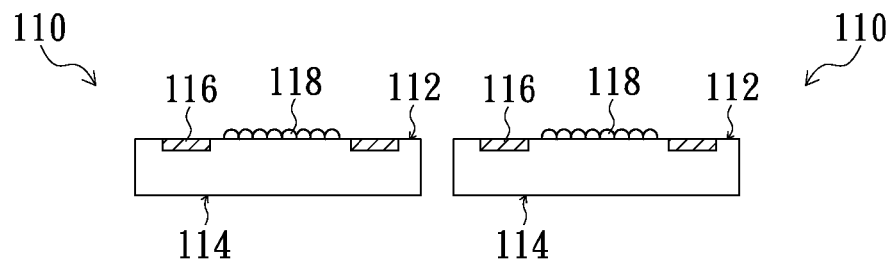
FIGS. 1A through 1G are schematic cross-sectional views associated with a semiconductor device in a packaging process in accordance with an embodiment of the present invention.

A better understanding of the above and many other features and advantages of the novel semiconductor device packaging structure and semiconductor device packaging method of the present invention may be obtained from a consideration of the detailed description of some exemplary embodiments thereof below, particularly if such consideration is made in conjunction with the appended drawings, wherein like reference numerals are used to identify like elements illustrated in one or more of the figures thereof.

FIGS. 1A through 1G are schematic cross-sectional views of a semiconductor device in a packaging process in accordance with an embodiment of the present invention. As illustrated in FIG. 1A, a plurality of wafer pieces 110 are firstly provided. Each of the wafer pieces 110 has an active surface 112 and a back surface 114 opposite to each other. There is at least one bonding pad 116 formed on the active surface 112. In particular, the bonding pad 116 is electrically connected with a circuit (not shown) formed on the active surface 112 of the corresponding wafer piece 110. Furthermore, there is also at least one semiconductor device 118 formed on the active surface 112 of each the wafer piece 110, and the semiconductor device 118 is electrically connected to an external circuit through the circuit and the bonding pad 116. In the illustrated embodiment, the semiconductor device 118 is for example a micro-lens array and a color filter array, but not limited to the present invention.

Figure 2:
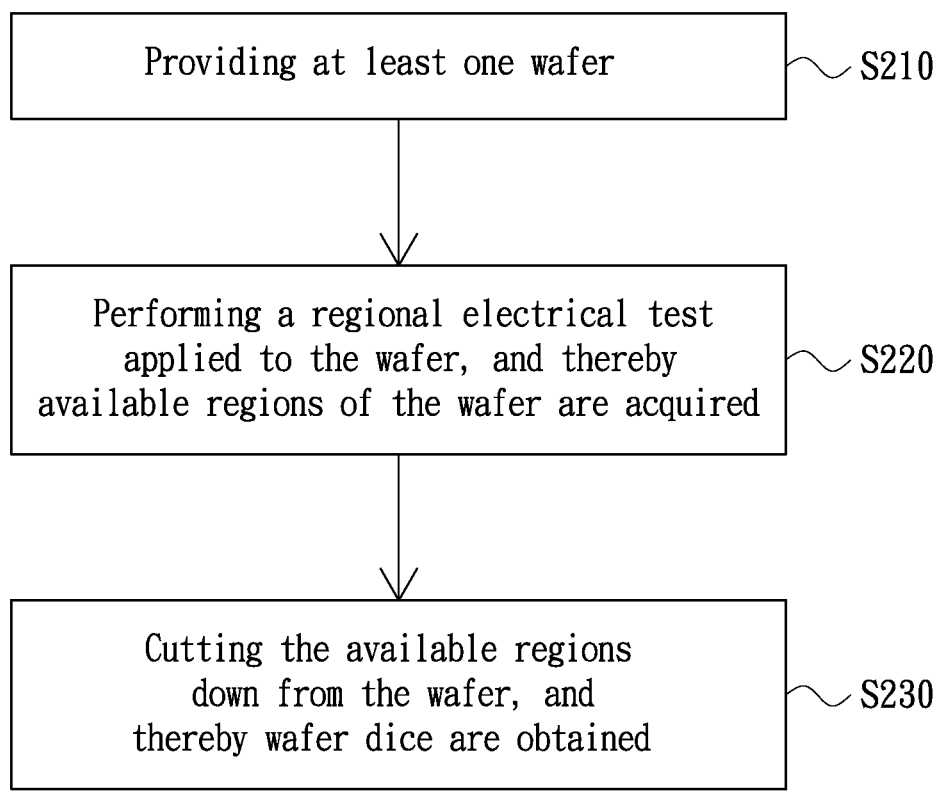
FIG. 2 is a flow chart of providing wafer pieces in accordance with an embodiment of the present invention.

More specifically, as illustrated in the step S210 of FIG. 2, in the present embodiment, at least one wafer is firstly provided. Subsequently, as illustrated in the step S220 of FIG. 2, a regional electrical test (e.g., probing test) is applied to the wafer to acquire available regions (i.e., known good regions) of the wafer. Afterwards, as illustrated in the step S230 of FIG. 2, the available regions are cut down from the wafer and thereby the wafer pieces 110 as illustrated in FIG. 1A can be obtained. It is noted that the present invention does not limit the shape of each of the wafer pieces 110.

Figure 1B:
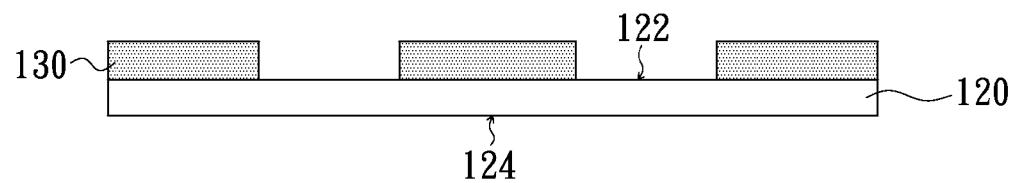

As illustrated in FIG. 1B, a carrier substrate 120 is provided. The carrier substrate 120 has a first surface 122 and an opposite second surface 124. An adhesive layer 130 is formed on the first surface 122 of the carrier substrate 120. The carrier substrate 120 is for example made of a transparent material (e.g., glass). A shape profile of the carrier substrate 120 is for example the same as that of a general wafer for matching with the current machine equipments, but not limited to this example. The adhesive layer 130 is for example made of a thermosetting material. Moreover, the adhering layer 130 surrounds the semiconductor device 118.

Figure 1C:
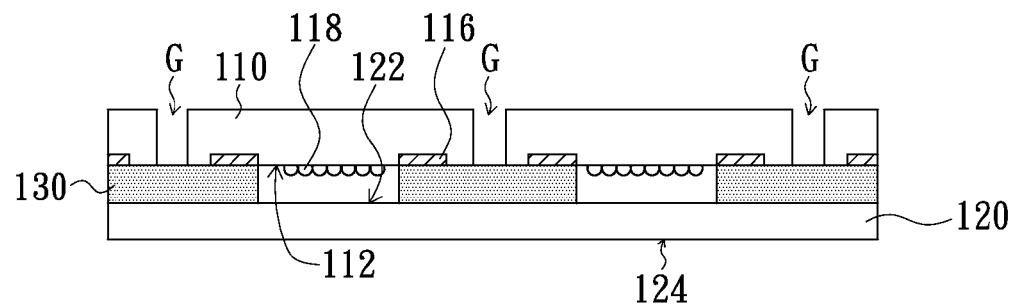

As illustrated in FIG. 1C, the active surface 112 of each of the wafer pieces 110 is adhered to the adhesive layer 130. In particular, the wafer pieces 110 are for example cut down from different wafers and then arranged on the first surface 122 of the carrier substrate 120. Herein, the wafer pieces 110 are fixed on the first surface 122 of the carrier substrate 120 through the adhesive layer 130. The wafer pieces 110 are arranged spaced from one another and each adjacent two of the wafer pieces 110 has a gap G existed therebetween. Each gap G exposes a part of the adhesive layer 130.

Figure 1D:
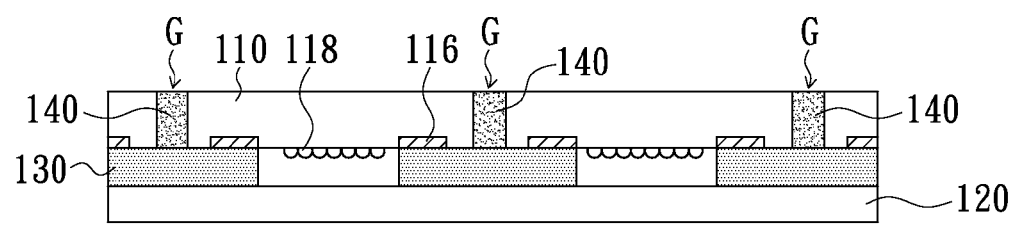

As illustrated in FIG. 1D, packaging layers 140 are formed filled into the respective gaps G. More specifically, the packaging layers 140 are for example made of an adhesive material and can be the same as or different from the material of the adhesive layer 130. In the illustrated embodiment, the packaging layers 140 are for example made of a thermosetting material as the same of the adhesive layer 130. Moreover, the packaging layers 140 are for example filled into the respective gaps G by a dispensing method.

Especially, in the illustrated embodiment, after the packaging layers 140 are formed filled into the respective gaps G, a grinding and polishing process is performed to removes portions of the packaging layers 140 protruding from the back surfaces 114 of the respective wafer pieces 110, so that the packaging layers 140 and the back surfaces 114 are coplanar with each other, facilitating the formation of subsequent layers.

Figure 1E:
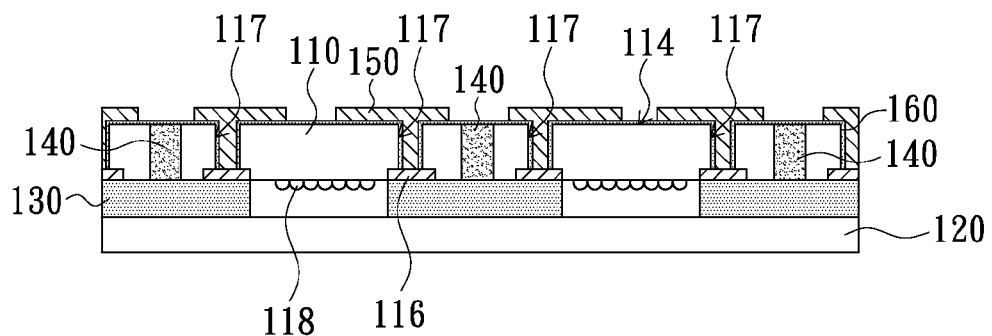

As illustrated in FIG. 1E, through silicon vias (TSVs) 127 are formed in the wafer pieces 110. The through silicon vias penetrate from the back surfaces 114 of the respective wafer pieces 110 to the active surfaces 112 and whereby exposing the bonding pads 116. Redistribution circuit layers 150 are formed on the back surfaces 114 of the respective wafer pieces 110 and filled into the through silicon vias 127 for electrical connection with the respective bonding pads 116.

It is indicated that, in the illustrated embodiment, before the redistribution circuit layers 150 are formed, a dielectric layer 160 is firstly formed on the back surfaces 114 of the wafer pieces 110 and filled into the through silicon vias 127 and whereby sidewalls of the through silicon vias 127 are covered by the dielectric layer 160. A part of the dielectric layer 160 in each of the through silicon vias 127 subsequently is removed to expose the corresponding bonding pad 116. The subsequently formed redistribution circuit layers 150 are disposed on the dielectric layer 160 for electrical insulation from the wafer pieces 110.

Figure 1F:
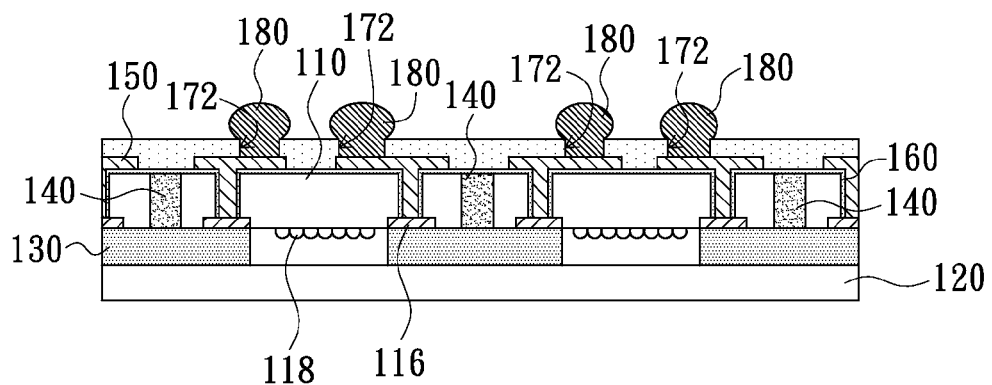

As illustrated in FIG. 1F, in order to protect the redistribution circuit layers 150 from damage in subsequent process, in the illustrated embodiment, a protective layer 170 is formed on the redistribution circuit layers 150. The protective layer 170 has a plurality of openings 172 respectively for exposing portions of the redistribution circuit layers 150 on the back surfaces 114 of the wafer pieces 110. Afterwards, a plurality of solder balls 180 are formed and filled into the respective openings 172 for electrical connection with the redistribution circuit layers 150. The semiconductor devices 118 formed in the active regions 111 of the wafer pieces 110 are electrically connected to external circuits through the solder balls 180.

Figure 1G:
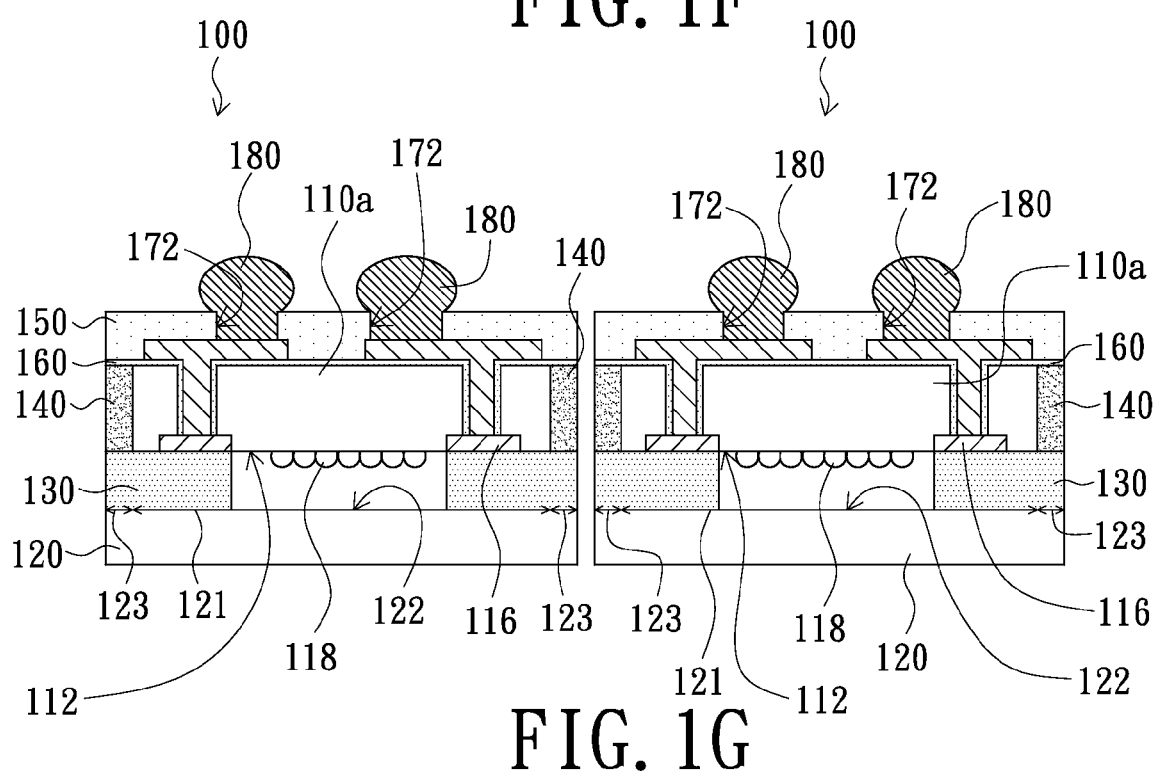

As illustrated in FIG. 1G, a sawing process is performed to saw starting from each of the packaging layers 140 to the second surface 124 of the carrier substrate 120 and thereby a plurality of semiconductor device packaging structures 100 of chip 110a are obtained. It is noted that, after performing the sawing process, peripheral region of the chip 110a of the semiconductor device packaging structure 100 have remained packaging layers 140, which can effectively prevent the chip 110a in subsequent process from damage resulting from water vapor permeating into the chip 110a.

In order to facilitate the skilled persons in the art to much better understand the present invention, a semiconductor device packaging structure manufactured by the above-mentioned method will be described below in detailed for the purpose of illustration.

Still referring to FIG. 1G, each semiconductor device packaging structure 110 includes a chip 110a, a carrier substrate 120, an adhesive layer 130, a redistribution circuit layer 150 and a packaging layer 140. The carrier substrate 120 has a first surface 112 with a configuration region 121 and a packaging region 123 surrounding the configuration region 121. The carrier substrate 120 is for example made of a transparent material, and a shape profile can be round for being consistent with the current machines, but is not limited to the present invention.

Furthermore, the chip 110a is disposed above the carrier substrate 120 and has an active surface 112, a back surface 114 and at least one through silicon via 117. The active surface 122 is opposite to the back surface 114 and faces toward the carrier substrate 120. The active surface 111 has at least one bonding pad 116 formed thereon. In the illustrated embodiment, the active surface 112 has a semiconductor device 118 formed thereon. For example, the semiconductor device 118 can include a micro-lens array and a color filter array, and the micro-lens array is disposed between the color filter array and the active surface 112 of the chip 110a.

Continuing to refer to FIG. 1G, the through silicon vias 117 penetrate from the back surface 114 of the chip 110a to the active surface 112 for exposing the bonding pads 116. Additionally, the semiconductor packaging structure 100 further includes a redistribution circuit layer 150 disposed on the back surface 114 of the chip 110a and filled into the through silicon vias 117 for electrical connection with the bonding pads 116. It is indicated that, in the illustrated embodiment, there is a dielectric layer 160 disposed between the redistribution circuit layer 150 and the chip 110a for facilitating the redistribution circuit layer 150 to electrically insulate from the chip 110a.

The adhesive layer 130 is disposed cross the configuration region 121 and the packaging region 123 and between the chip 110a and the carrier substrate 120. In the illustrated embodiment, the adhesive layer 130 is for example made of a thermosetting material and surrounds the semiconductor device 118. The packaging layer 140 is disposed on the adhesive layer 130 and corresponds to the packaging region 123 of the carrier substrate 120 for surrounding the chip 110a. Therefore, the packaging layer 140 may avoid ambient water vapor to permeate into the chip 110a. In particular, the packaging layer 140 is for example made of a glue material, and the material of the packaging layer 140 can be the same as or similar to the material of the adhesive layer 130. In the illustrated embodiment, the packaging layer 140 is for example made of a thermosetting material.

In addition, the semiconductor device packaging structure 100 associated with the present embodiment can further include a protective layer 170 and at least one solder ball 180. The protective layer 170 is disposed on the redistribution circuit layer 150 and has at least one opening 172 to expose a part of the redistribution circuit layer 150. The solder balls 180 are disposed on the protective layer 170 and filled into the openings 172 for electrical connection with the redistribution circuit layer 150. In short, the semiconductor device 118 on the active surface 112 of the chip 110a is electrically connected with the redistribution circuit layer 150 through the bonding pads 116 and then electrically connected to an external circuit by the solder balls 180.

In summary, the embodiments of the present invention firstly cut a plurality of available regions down from a wafer (s) to obtain wafer pieces, and then bond the wafer pieces to the carrier substrate. The size and shape of the carrier substrate can be designed to a round carrier substrate matched with current wafer packaging machines according to the requirement of practical application. In other words, regardless of the wafer pieces being cut down from an 8 inches and/or a 12 inches wafer, the wafer pieces can be firstly bonded to a same carrier substrate and then are processed in subsequent process by using current packaging machines. Since the wafer pieces are available regions of the original wafer(s), the embodiments of the present invention only perform the packaging process on the wafer pieces, which not only can reduce the process cost but also can improve the yield of semiconductor device.

Moreover, in the semiconductor device packaging structure associated with the present invention, the chip is surrounded by the packaging layer, which can prevent the chip from damage resulting from ambient water vapor permeating into and even can avoid the wafer pieces to be cracked in the subsequent process resulting from encountering external force.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A semiconductor device packaging method comprising:
    providing a plurality of wafers;
    performing an electrical test applied to each of the wafers to acquire a plurality of available regions of each of the wafers;
    cutting the available regions down from the wafers, and thereby a plurality of wafer pieces are obtained, each of the wafer pieces having an active surface and a back surface, the active surface being opposite to the back surface and at least one bonding pad formed thereon;
    providing at least one carrier substrate having a first surface and a second surface opposite to each other;
    forming an adhesive layer on the first surface of the carrier substrate;
    bonding the wafer pieces to the carrier substrate by contacting the active surfaces of the wafer pieces with the adhesive layer, wherein each adjacent two of the wafer pieces are separated with a gap therebetween and whereby a part of the adhesive layer is exposed;
    filling a packaging layer into each of the gaps;
    forming at least one through silicon via in each of the wafer pieces to expose the bonding pad;
    forming a redistribution circuit layer on the back surface of each of the wafer pieces and filled into the through silicon via for electrical connection with the bonding pad; and
    performing a sawing process to saw starting from each of the packaging layers to the second surface of the carrier substrate, and thereby a plurality of semiconductor device packaging structures are obtained.

2. The semiconductor device packaging method as claimed in claim 1, before performing the sawing process, further comprising:
    forming a protective layer on the back surfaces of the wafer pieces to cover the redistribution circuit layers, wherein the protective layer has a plurality of openings each exposing a part of each of the redistribution circuit layers; and forming a plurality of solder balls filled into the openings for electrical connection with the respective redistribution circuit layers.

3. The semiconductor device packaging method as claimed in claim 1, after forming the through silicon vias and before forming the redistribution circuit layers, further comprising:
   forming a dielectric layer on the back surfaces of the wafer pieces, wherein the dielectric layer is filled into the through silicon vias; and
   removing a part of the dielectric layer filled in the through silicon vias to expose the bonding pads.

4. The semiconductor device packaging method as claimed in claim 1, before forming the through silicon vias, further comprising:
   thinning the wafer pieces.

5. The semiconductor device packaging method as claimed in claim 1, wherein a method for filling the packaging layers into the gaps comprises dispensing.

6. The semiconductor device packaging method as claimed in claim 5, after filling the packaging layers into the gaps, further comprising:
   performing a grinding and polishing process applied to the packaging layers, to remove a portion of each of the packaging layers protruding from the back surfaces of the wafer pieces.

* * * * *

UNITED STATES PATENT AND TRADEMARK OFFICE
CERTIFICATE OF CORRECTION

| | |
|---|---|
| PATENT NO. | : 8,460,971 B2 |
| APPLICATION NO. | : 12/774811 |
| DATED | : June 11, 2013 |
| INVENTOR(S) | : Chang |

It is certified that error appears in the above-identified patent and that said Letters Patent is hereby corrected as shown below:

In the Specification

In Column 5, Lines 2-3, delete "first surface 112" and insert -- first surface 122 --, therefor.

In Column 5, Lines 11-12, delete "active surface 122" and insert -- active surface 112 --, therefor.

Signed and Sealed this
Twenty-fifth Day of March, 2014

Michelle K. Lee
*Deputy Director of the United States Patent and Trademark Office*